(12) United States Patent
Frayer et al.

(10) Patent No.: US 10,090,588 B2
(45) Date of Patent: Oct. 2, 2018

(54) SELECTIVELY CHROME PLATED VEHICLE RADOME AND VEHICLE RADIATOR GRILLE AND METHODS OF MANUFACTURING

(71) Applicant: SRG Global Inc., Warren, MI (US)

(72) Inventors: Rob Frayer, Huntington Woods, MI (US); James Michael Shurish, Casco, MI (US); Nicholas Bruyneel, Ortonville, MI (US)

(73) Assignee: SRG Global Inc., Warren, MI (US)

( * ) Notice: Subject to any disclaimer, the term of this patent is extended or adjusted under 35 U.S.C. 154(b) by 89 days.

(21) Appl. No.: 15/275,747

(22) Filed: Sep. 26, 2016

(65) Prior Publication Data

US 2018/0090831 A1 Mar. 29, 2018

(51) Int. Cl.
*B32B 3/02* (2006.01)
*H01Q 1/42* (2006.01)
(Continued)

(52) U.S. Cl.
CPC ............ *H01Q 1/42* (2013.01); *B29C 45/1615* (2013.01); *B60R 19/52* (2013.01); *H01Q 1/44* (2013.01);
(Continued)

(58) Field of Classification Search
CPC .......... H01Q 1/42; H01Q 1/44; H01Q 1/3233; B60R 19/52; B60R 2019/525;
(Continued)

(56) References Cited

U.S. PATENT DOCUMENTS

| | | |
|---|---|---|
| 5,452,931 A | 9/1995 | Chase |
| 5,487,575 A | 1/1996 | Chase |
| 6,184,842 B1 | 2/2001 | Leinweber et al. |
| 6,328,358 B1 | 12/2001 | Berweiler |
| 6,961,023 B2 | 11/2005 | Fujii et al. |
| 7,295,166 B2 | 11/2007 | Fujii et al. |
| 7,619,575 B2 | 11/2009 | Kamiya et al. |
| 7,846,498 B2 | 12/2010 | Ido et al. |
| 8,287,990 B2 | 10/2012 | Maeda et al. |
| 8,702,135 B2 | 4/2014 | Gaboury et al. |
| 8,974,712 B2 | 3/2015 | Ohtake et al. |
| 9,114,760 B2 | 8/2015 | Pujadas |

(Continued)

FOREIGN PATENT DOCUMENTS

| | | |
|---|---|---|
| DE | 4426803 A1 | 2/1995 |
| EP | 1016516 A1 | 7/2000 |
| EP | 2151889 A1 | 2/2010 |
| EP | 2455260 B1 | 7/2014 |
| JP | 2005112193 A | 4/2005 |
| JP | 4657070 B2 | 3/2011 |
| JP | 5460218 B2 | 4/2014 |

(Continued)

OTHER PUBLICATIONS

PCT International Search Report and Written Opinion dated Oct. 24, 2017 for PCT International Application No. PCT/US2017/047310, 11 pages.

*Primary Examiner* — Elizabeth E Mulvaney

(57) ABSTRACT

A selectively chrome plated radome and its method of manufacture include molding a non-plateable resin to form one or more inner pieces, each inner piece defining an outer edge, inserting the one or more inner pieces into a final mold, injecting a plateable resin into the final mold to form an outer piece arranged about and coupled to the outer edge of each inner piece, wherein the one or more inner pieces and the outer piece collectively form a radome component, removing the radome component from the final mold, and chrome plating the outer piece of the radome component to obtain the selectively chrome plated radome. A selectively chrome plated radiator grille and its method of manufacture include molding a plateable resin portion of the grille, the plateable resin portion defining the outer piece of the radome component, and then chrome plating an exposed surface of the plateable resin portion.

19 Claims, 5 Drawing Sheets

(51) Int. Cl.
    *B60R 19/52*    (2006.01)
    *H01Q 1/44*    (2006.01)
    *B29C 45/16*    (2006.01)
    *H01Q 1/32*    (2006.01)
    *B29K 69/00*    (2006.01)
    *B29K 33/00*    (2006.01)
    *B29K 55/02*    (2006.01)
    *B29L 31/30*    (2006.01)
    *B29L 31/34*    (2006.01)
    *B29L 9/00*    (2006.01)

(52) U.S. Cl.
    CPC ...... *B29K 2033/12* (2013.01); *B29K 2055/02* (2013.01); *B29K 2069/00* (2013.01); *B29L 2009/006* (2013.01); *B29L 2031/3005* (2013.01); *B29L 2031/3456* (2013.01); *B60R 2019/525* (2013.01); *H01Q 1/325* (2013.01)

(58) Field of Classification Search
    CPC .......................... B29C 45/16; B29K 2055/02; B29K 2069/00; B29L 3031/722; B29L 3031/3456; B29L 2009/005

See application file for complete search history.

(56) References Cited

U.S. PATENT DOCUMENTS

| | | |
|---|---|---|
| 2009/0286072 A1 | 11/2009 | Küchler et al. |
| 2014/0313100 A1 | 10/2014 | Yamamoto |
| 2015/0226836 A1* | 8/2015 | Shim .................. G01S 7/02 428/336 |
| 2017/0368727 A1* | 12/2017 | Brown ................ B29C 45/0053 |

FOREIGN PATENT DOCUMENTS

| | | |
|---|---|---|
| JP | 5735196 B2 | 6/2015 |
| WO | 2008061786 A1 | 5/2008 |

* cited by examiner

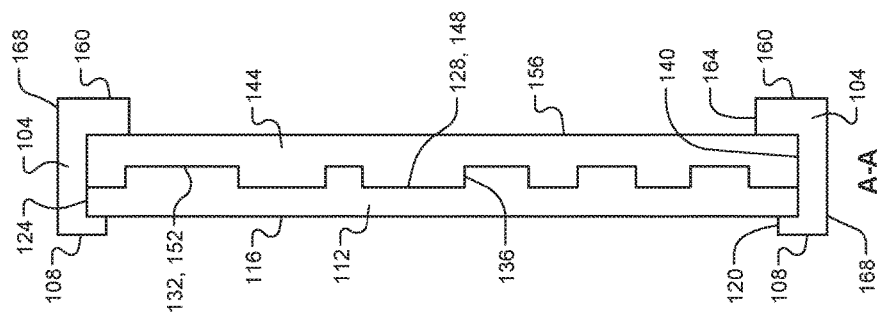
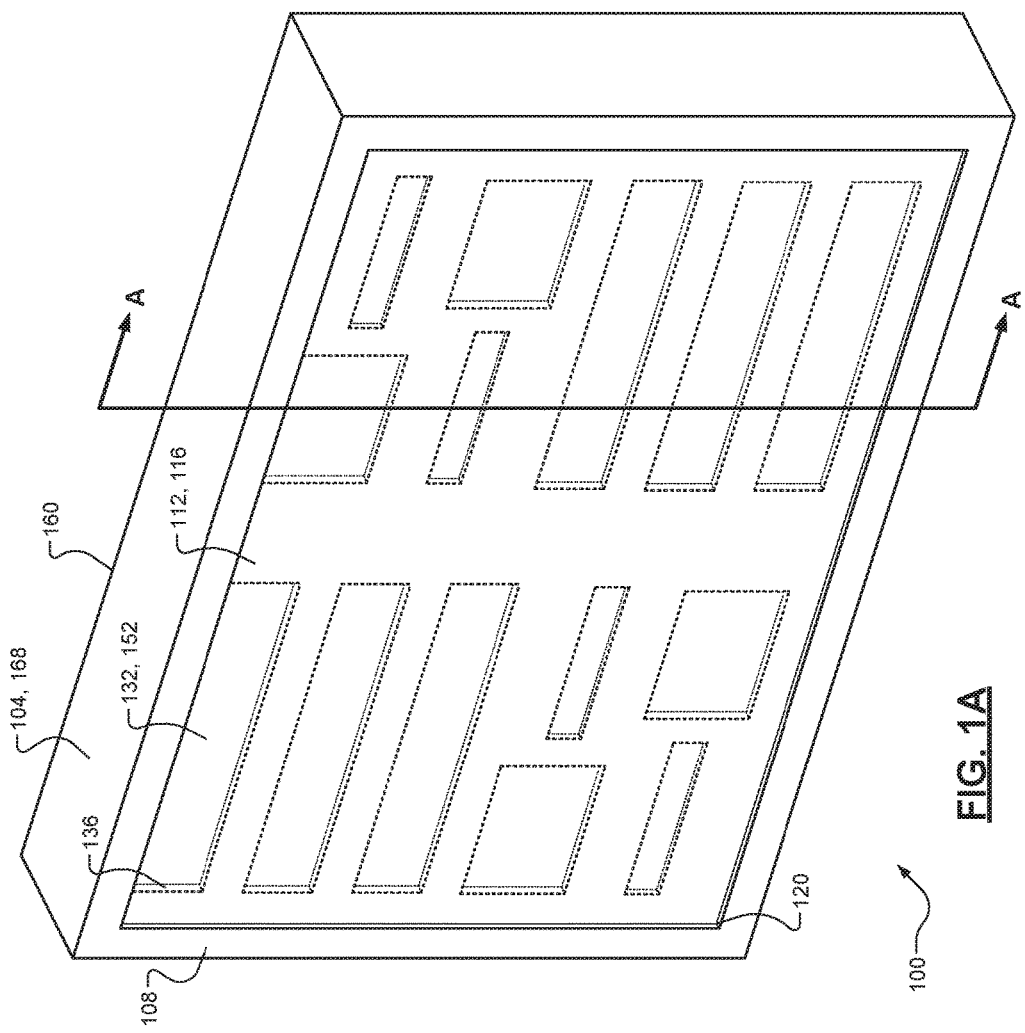

SELECTIVELY CHROME PLATED VEHICLE RADOME AND VEHICLE RADIATOR GRILLE AND METHODS OF MANUFACTURING

FIELD

The present disclosure generally relates to radomes for vehicles and, more particularly, to selectively chrome plated vehicle radomes and vehicle radiator grilles and their methods of manufacture.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A radar cover or "radome" is a structure or enclosure that protects a radar device (e.g., a radar antenna). For vehicle applications, a radar device can be used for object proximity monitoring, such as in adaptive cruise control systems and other similar systems (e.g., parking assistance systems). For optimal performance of the radar device, the radome should be constructed of material that minimally attenuates electromagnetic signals that are transmitted and received by the radar device. Certain metals, for example, can attenuate electromagnetic signals. For vehicle applications, the radome is often visible and therefore should also be visually appealing. For example, the radome may be mounted to an external surface of the vehicle, such as on a radiator grille of the vehicle.

SUMMARY

According to one aspect of the present disclosure, a selectively chrome plated radome for a vehicle is presented. In one exemplary implementation, the selectively chrome plated radome can comprise one or more inner pieces each (i) formed of a non-plateable resin and (ii) defining an outer edge; an outer piece formed of a plateable resin and arranged about and coupled to the outer edge of each inner piece; and a chrome plating applied to an exposed surface of the outer piece.

In some implementations, the selectively chrome plated radome further comprises one or more decorative layers applied to a face of one of the one or more inner pieces, wherein the one or more decorative layers include at least one of (i) paint, (ii) a colored graphic, and (iii) a metalloid or a post-transition metal deposited via physical vapor deposition (PVD). In some implementations, each inner piece is formed using a separate mold, and wherein the outer piece is overmolded about the outer edges of the inner pieces using a final mold. In some implementations, outer piece is formed during a second shot of a two-shot (2K) injection molding process. In some implementations, the non-plateable resin is one of polycarbonate (PC) and polymethyl methacrylate (PMMA), and wherein the plateable resin is one of acrylonitrile butadiene styrene (ABS) and PC-ABS.

In some implementations, the one or more inner pieces include (i) a front piece formed of the non-plateable resin and defining a first outer edge and (ii) a back piece formed of the non-plateable resin and defining a second outer edge, and wherein the outer piece is arranged about and coupled to the first and second outer edges such that the front and back pieces are held together. In some implementations, one of the front and back pieces defines a protrusion, and wherein the other of the front and back pieces defines a recess that corresponds to the protrusion.

In some implementations, the selectively chrome plated radome further comprises one or more decorative layers disposed between the front and back pieces, wherein the one or more decorative layers include at least one of (i) paint, (ii) a colored graphic, and (iii) a metalloid or a post-transition metal deposited via PVD. In some implementations, the one or more inner pieces further include an intermediary piece (i) formed of one of the non-plateable and plateable resins, (ii) having the one or more decorative layers applied thereto, and (iii) arranged between the front and back pieces.

According to another aspect of the present disclosure, a selectively chrome plated radiator grille having the inner and outer pieces integrated therewith is presented. In one exemplary implementation, the grille can comprise a plateable resin portion that defines the outer piece.

According to another aspect of the present disclosure, a method of manufacturing a selectively chrome plated radome for a vehicle is presented. In one exemplary implementation, the method can comprise: molding a non-plateable resin in one or first molds to form one or more inner pieces, each inner piece defining an outer edge; inserting the one or more inner pieces into a second mold; injecting a plateable resin into the second mold to form an outer piece arranged about and coupled to the outer edge of each inner piece, wherein the one or more inner pieces and the outer piece collectively form a radome component; removing the radome component from the second mold; and chrome plating an exposed surface of the outer piece of the radome component to obtain the selectively chrome plated radome.

In some implementations, the method further comprises applying one or more decorative layers to a face of one of the one or more inner pieces, wherein the one or more decorative layers include at least one of (i) paint, (ii) a colored graphic, and (iii) a metalloid or a post-transition metal deposited via PVD. In some implementations, the one or more inner pieces further include an intermediary piece (i) formed of one of the non-plateable and plateable resins, (ii) having the one or more decorative layers applied thereto, and (iii) arranged between the front and back pieces. In some implementations, the non-plateable resin is one of PC and PMMA, and the plateable resin is one of ABS and PC-ABS. In some implementations, the method further comprises performing a 2K injection molding process, wherein a second shot of the 2K injection molding process involves injecting the plateable resin into the second mold.

In some implementations, the one or more inner pieces include (i) a front piece formed of the non-plateable resin and defining a first outer edge and (ii) a back piece formed of the non-plateable resin and defining a second outer edge, and wherein the outer piece is arranged about and coupled to the first and second outer edges such that the front and back pieces are held together. In some implementations, one of the front and back pieces defines a protrusion, and wherein the other of the front and back pieces defines a recess that corresponds to the protrusion. In some implementations, the method further comprises applying one or more decorative layers between the front and back pieces, wherein the one or more decorative layers include at least one of (i) paint, (ii) a colored graphic, and (iii) a metalloid or a post-transition metal deposited via PVD.

According to another aspect of the present disclosure, a method for manufacturing a selectively chrome plated radiator grille is presented. In one exemplary implementation, this method can comprise a portion of the method of manufacturing the radome, and can further comprise: inserting the one or more inner pieces into a third mold; injecting the plateable resin into the third mold to form a radiator grille component comprising a plateable resin portion defining the outer piece; removing the radiator grille component from the third mold; and chrome plating an exposed surface of the plateable resin portion of the radiator grille component to obtain the chrome plated radiator grille having the radome component integrated therewith.

In some implementations, the one or more inner pieces comprise at least a front piece and a back piece, and further comprising performing a 2K injection molding process comprising: inserting the front piece into the third mold; after inserting the one of the front piece into the third mold, performing a first shot by injecting into the third mold one of (i) the non-plateable resin to form a non-plateable resin portion of the radiator grille component defining the back piece and (ii) the plateable resin to form the plateable resin portion of the radiator grille component; and after performing the first shot, performing a second shot by injecting into the third mold the other of (i) the non-plateable resin to form the non-plateable resin portion of the radiator grille component and (ii) the plateable resin to form the plateable resin portion of the radiator grille component.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1A is a view of an example selectively chrome plated vehicle radome according to some implementations of the present disclosure;

FIG. 1B is a cross-sectional view (A-A) of the example selectively chrome plated vehicle radome of FIG. 1A;

DETAILED DESCRIPTION

Figure 1C:
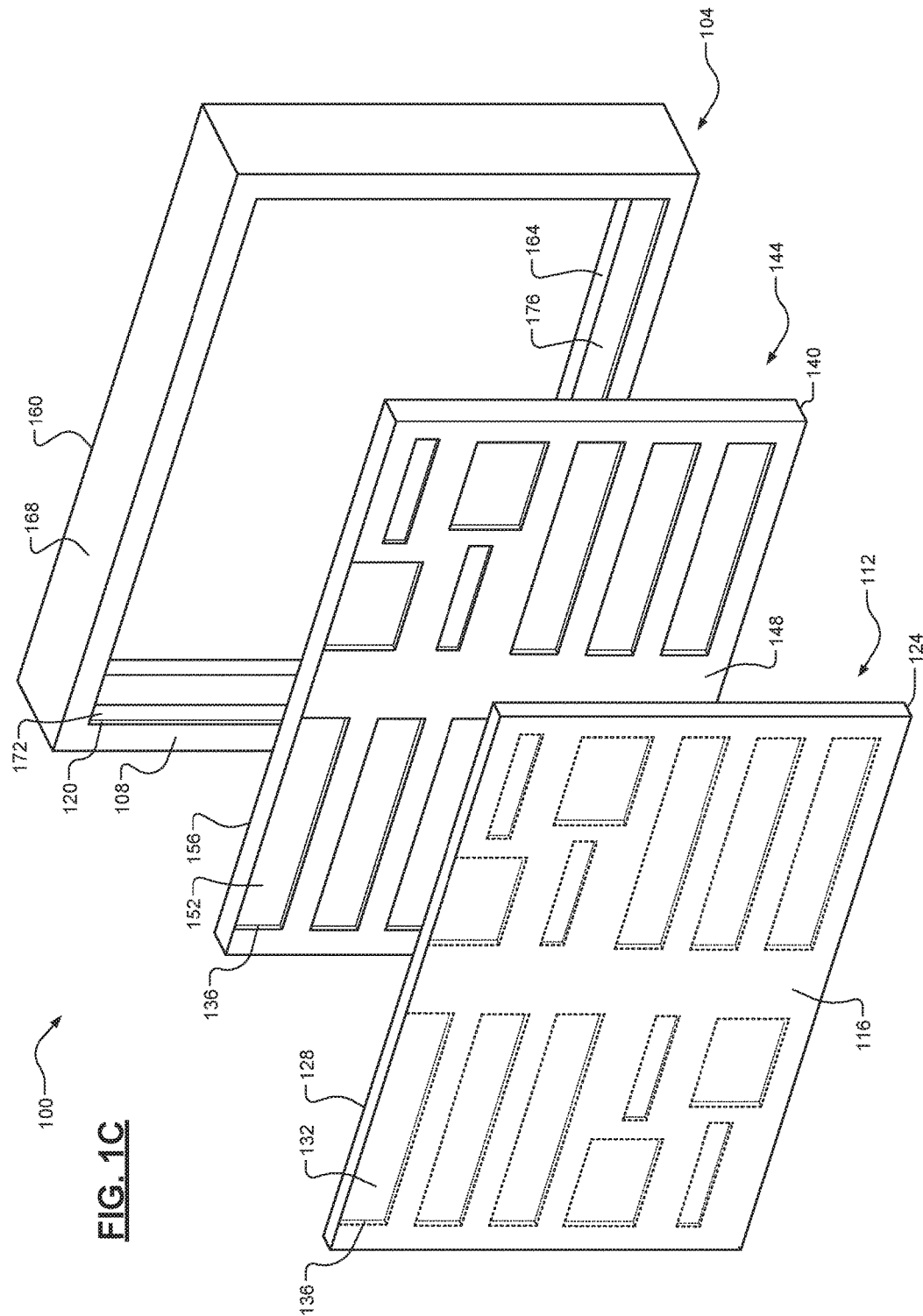
FIG. 1C is an exploded view of the example selectively chrome plated vehicle radome of FIG. 1A.

As previously mentioned, a radome for a vehicle is visible and should therefore be visually appealing. Decorative metal coatings (e.g., for accenting designs, such as a vehicle's brand symbol) can be expensive and/or can attenuate electromagnetic signals. Selective electroplating (e.g., chrome plating), for example, typically requires applying masks to portions of the radome that are not being plated and then removing the masks after plating. This process is time consuming and expensive. Accordingly, an improved selective chrome plated vehicle radome and a method of manufacturing the selective chrome plated vehicle radome are presented. In addition to visual appearance, another benefit of the selective chrome plated vehicle radome is an improved edge seal for better weatherability. In other implementations, an improved vehicle radiator grille that is at least partially chrome plated and that incorporates the improved selective chrome plated radome and a method of manufacturing the improved vehicle radiator grille are presented. The method can provide, for example, for a cheaper and/or faster method of obtaining a selectively plated vehicle radome.

In one exemplary implementation, the selective chrome plated vehicle radome can be formed using a two-shot (2K) injection molding process. A first inner piece (e.g., a clear cover piece) can initially be formed in a mold. The first inner piece can then be inserted into another mold for the 2K process. In a first shot of the 2K process, one of a non-plateable resin and a plateable resin is injected into the mold. One or more other inner pieces can be formed during this first shot. For example, a second inner piece (e.g., a clear or opaque back piece) can be formed of the non-plateable resin. In a second shot, the other of the non-plateable resin and the plateable resin is injected into the mold.

In one exemplary implementation, the second shot is a plateable resin that overmolds outer edges of inner pieces of the vehicle radome. In such an implementation, the inner pieces can include a front piece formed of a first non-plateable resin and one or more decorative layers, which can be applied to a back surface of the front piece, to a front surface of an intermediary piece, and/or to a front surface of a back piece formed of a second non-plateable resin. The first and second non-plateable resins may be the same. In another exemplary implementation, multiple single injection molding shots are performed. More specifically, each of the one or more inner pieces is formed from non-plateable resin using a separate mold. The inner piece(s) are then inserted into another mold (e.g., a final mold) and plateable resin is overmolded around outer edge(s) of the inner piece(s) to form the outer piece.

Non-limiting examples of the decorative layers include paint, a metalloid (e.g., silicon) or a post-transition metal (tin, indium, etc.) deposited via physical vapor deposition (PVD), a film, and combinations thereof. Non-limiting examples of the non-plateable resin are polycarbonate (PC) and polymethyl methacrylate (PMMA) and non-limiting examples of the plateable resin are acrylonitrile butadiene styrene (ABS) and polycarbonate-ABS (PC-ABS). It will be appreciated, however, that other suitable materials could be used. After the second shot, a radome component is removed from the mold. The radome component represents the vehicle radome without any chrome plating. The radome component is then chrome plated to form the chrome plated vehicle radome. While the entire radome component may be subject to a chrome plating process, only an exposed surface of the outer piece formed of the plateable resin will have the chrome plating adhered thereto.

Because the other exposed surfaces are formed of non-plateable resin (e.g., PC), the chrome plating will not adhere to these surfaces. Thus, there will not be any chrome plating in the radar field-of-view that could affect radar performance. Further, because there is no masking/stripping of materials applied to/removed from these other exposed surfaces, no damage will occur to these exposed surfaces that could affect the appearance of the decorative radome.

In one exemplary implementation, the selectively chrome plated vehicle radome can be formed as part of the process of forming and chrome plating a radiator grille for the vehicle. By forming the radiator grille and the radome as an integrated unit via the same process, time can be saved and there can be less handling of the components (e.g., compared to forming the components separately and then attaching the radome to the grille). In this implementation, the inner piece(s) can be inserted into a mold for the grille, and the plateable resin can be injected into the mold to form a grille component having the radome component integrated therewith. The grille component can then be chrome plated to obtain a selectively chrome plated grille (i.e., non-radome portions of the grille formed of the plateable resin) that has the radome (now chrome plated) integrated therewith. In one implementation, one of the inner pieces of the radome could be initially molded and then inserted into a 2K grille mold, and a first shot could inject either plateable or non-plateable resin for both the grille and the radome, and a second should could inject the other of the plateable and non-plateable resins for both the grille and the radome, resulting in a fully integrated unit. While a 2K grille comprising both non-plateable and plateable resin is discussed herein, it will be appreciated that the grille could be formed of only plateable resin while still having the radome integrated therein.

Referring now to FIGS. 1A-1C, an example selectively chrome plated vehicle radome 100 (hereinafter, "radome 100") is illustrated. While a rectangular shape and recessed features are illustrated and discussed herein, it will be appreciated that the radome 100 can have other shapes and/or designs. The radome 100 can include an outer piece 104 that is formed of a plateable resin (e.g., ABS or ABS-PC) and that defines a front surface 108. A first inner piece 112 is formed of a clear non-plateable resin (e.g., PC or PMMA) and defines a front surface 116. The first inner piece 112 can be arranged such that its front surface 116 is offset from the front surface 108 of the outer piece 104 by an offset distance 120. This overhang or overmolding of the outer piece 104 around an outer edge 124 of the hollow outer piece 104 can seal the first inner piece 112 therein. A rear surface 128 of the first inner piece 112 can define protrusions 132 (with respect to outer edge 124) that define a depth 136. The hollow piece 104 also overhangs or overmolds an outer edge 140 of a second inner piece 144 formed of a clear or opaque non-plateable resin (e.g., PC or PMMA) such that the outer piece 104 can seal the second inner piece 144 therein.

A front surface 148 of the second inner piece 144 can define recesses 152 (with respect to outer edge 140) that define the same depth 136 as the protrusions 132 defined by the first inner piece 112. In other words, these protrusions 132 and the recesses 152 correspond to each other or are otherwise complimentary such that the first and second inner pieces 112, 144 can fit together. In other implementations, the front surface 148 could define protrusions and the rear surface 128 could define complimentary recesses. A back surface 156 of the second inner piece 144 can be offset a back surface 160 of the outer piece 104 by an offset distance 164 (as part of the overhang or overmolding). It will be appreciated, however, that the pieces 104, 112, 144 can be held together via chemical bonds or melt bonds. The front and back surfaces 108, 160, overhangs/overmolds 120, 164, and an outer side/edge surface 168 (collectively, "an exposed surface") of the outer piece 104 can also have chrome plating applied thereto. Overmold 164 can also be longer (i.e., towards a center of the radome 100) than overmold 120 because a field of view of a radar device positioned behind the radome 100 (on the side nearest back surface 156) will increase in the direction towards front surface 116.

While not shown, it will be appreciated that the radome 100 could include other numbers of inner pieces and/or decorative layers. In one exemplary implementation, the radome 100 could include a single inner piece, which could optionally define protrusions and/or recess (e.g., to give the appearance of depth) and/or one or more decorative layers. It will be appreciated that the decorative layer(s) can be applied to any suitable faces of the inner pieces 112, 144. In another exemplary implementation, the radome 100 could include three or more pieces (i.e., one or more intermediary pieces). Because these one or more intermediary pieces are sealed between the outer piece 104 and the other inner pieces 112, 144, the intermediary piece(s) could each be formed of either non-plateable resin or plateable resin (because there would be no exposed surface for the plateable resin to receive the chrome plating). Non-limiting examples of the decorative layers include paint, such as for color or as primer for other layers, single or multi-colored graphics, and a metalloid or a post-transition metal. This color application, for example, could be performed by techniques such as applying paint (spray, silk screen, etc.), hot stamping a colored or multi-colored film, and the like. The metalloid or the post-transition metal, for example, could be deposited using a physical vapor deposition (PVD) process. Non-limiting examples of PVD techniques include cathodic arc deposition, electron beam PVD, evaporative deposition, pulsed laser deposition, and sputter deposition. The purpose of such decorative layer(s), for example, could be to further enhance the appearance of the vehicle's brand symbol, which could be defined, for example, by the protrusions 132 and recesses 152.

One or more of the inner pieces 112, 144 (or intermediary piece(s)) for example, could have a decorative layer applied thereto. In one exemplary implementation, the radome 100 has a three-layer configuration with a single PC intermediary piece with a metalloid applied thereto. When the first inner piece 112 (and in some cases, the intermediary piece) are clear or transparent, the metalloid layer would not appear as metallic. Instead, the metalloid layer would appears as more of a tinting (e.g., similar to window tinting). When the second inner piece 144 is opaque (e.g., black), however, the metalloid layer could appear bright or shiny, similar to a metal. Metalloids, in contrast to metals, are also radar-transparent, and thus they would not negatively affect radar transmission through the radome 100. The metalloid layer, for example, can comprise silicon and, in some implementations, other materials (dopants, germanium, etc.). In some implementations, the metalloid layer can include three total layers: a painted base layer, the deposited metalloid, and a top coat. The top coat could be the portion that faces towards the front of the radome 100 (e.g., towards the first inner piece 112).

Referring now to FIG. 1C and with continued reference to FIGS. 1A-1B, an exploded view of the radome 100 is illustrated. This exploded view further illustrates how the pieces 104, 112, and 144 fit together. As can be seen, the first inner piece 112 is a clear non-plateable resin (e.g., PC) with its rear surface 128 defining protrusions 132. These protrusions 132 fit in the recesses 152 defined in the front surface 148 of the second inner piece 144. As previously mentioned, the protrusions and recesses could be switched (e.g., front surface 148 could define protrusions and rear surface 128 could define complimentary recesses). Both inner pieces 112, 144 fit within the outer piece 104. Portion 172 of the outer piece 104 aligns with the outer edge 124 of the first inner piece 112 and portion 176 of the outer piece 104 aligns with the outer edge 140 of the second inner piece 144.

Because the outer piece 104 is arranged around these outer edges 124, 140 of the inner pieces 112, 144 and because the outer piece 104 overhangs or is overmolded over a portion of these inner pieces 112, 144 (see, e.g., features 120 and 164), it will be appreciated that the outer piece 104 can be formed during a subsequent or final molding step during the manufacturing of the radome 100. As discussed in greater detail below, because these pieces 112, 144 are complimentary and thus can be mated together, the subsequent/final molding step (e.g., a second shot of a 2K process) to form the outer piece 104 does not require these inner pieces 112, 144 to be physically attached to each other (e.g., using additional devices, such as snaps and/or clamps). This simplifies and could potentially reduce costs of the final molding process. At least some of these components, such as inner pieces 112 and 144, could also be physically snapped together or could be loosely held together (e.g., only for the purpose of being easily inserted into the mold without additional attachment/securing devices).

Figure 2:
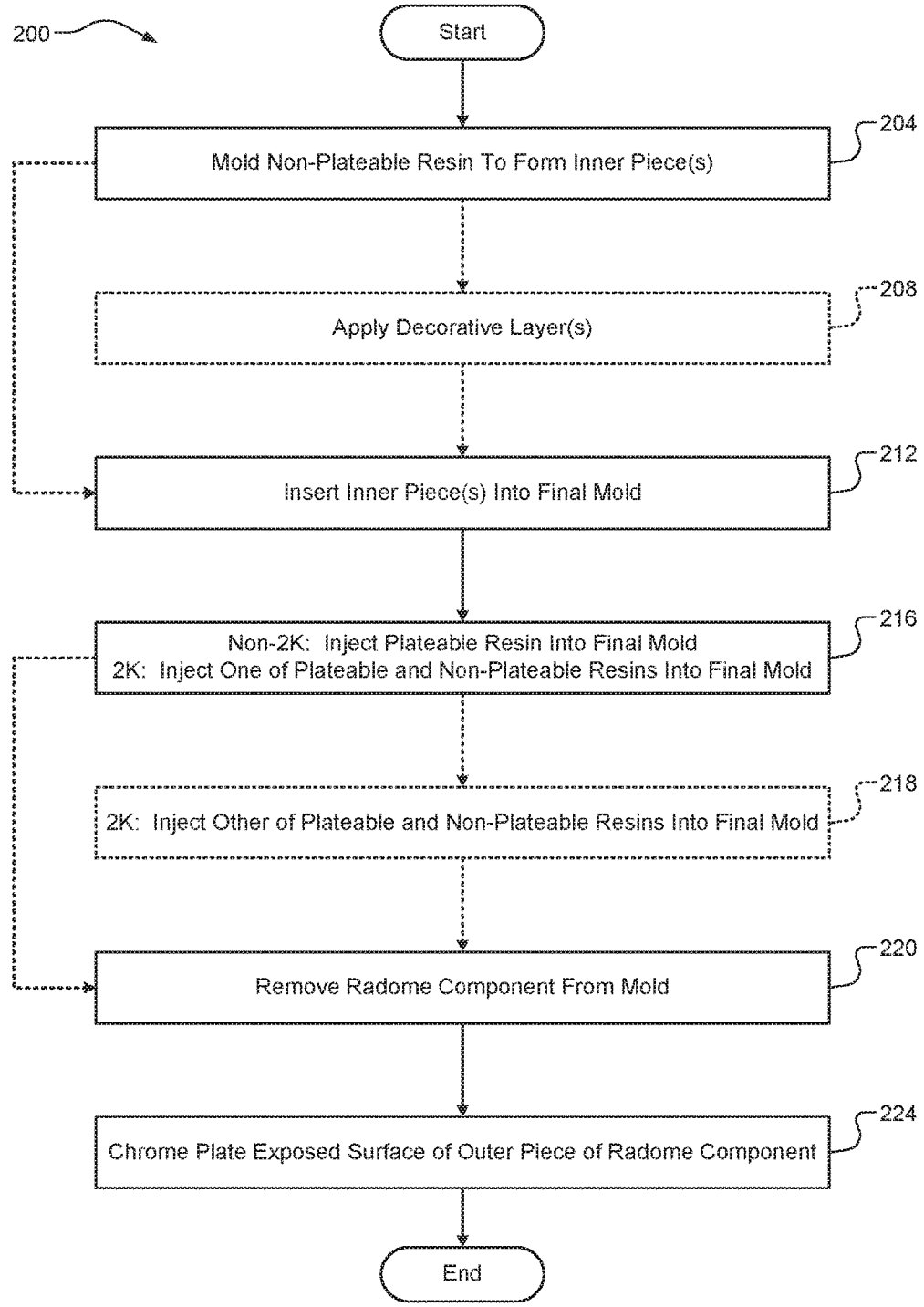
FIG. 2 is a flow diagram of an example method of manufacturing a selectively chrome plated vehicle radome according to some implementations of the present disclosure.

Referring now to FIG. 2, a flow diagram of an example method 200 for manufacturing a selectively chrome plated vehicle radome (e.g., radome 100) is illustrated. At 204, non-plateable resin (e.g., PC or PMMA) is molded to form one or more inner pieces (e.g., inner pieces 112, 144). For the non-2K process, each inner piece can be formed using a separate mold. For the 2K process, on the other hand, the first inner piece 112 (and, optionally, the intermediate inner piece) can be initially molded. At 208, one or more decorative layers are optionally applied to one or more faces of the inner piece(s). At 212, the one or more inner pieces are inserted into a mold (e.g., a final mold). This mold, for example, may be different than the mold(s) used to form the inner piece(s). At 216, plateable resin (e.g., ABS or ABS-PC) is injected into the mold. For the 2K process, however, one of the non-plateable and plateable resins is injected into the final mold at 216 (e.g., inject the non-plateable to form the second back piece 144) and then the other of the non-plateable and plateable resins is injected into the final mold at optional 218. At 220, a radome component (i.e., a non-chrome plated radome) is removed from the mold. At 224, the radome component is chrome plated and the chrome plating adheres to the plateable resin (e.g., the exposed surface of the outer piece 104) to form the selectively chrome plated vehicle radome.

Figure 3:
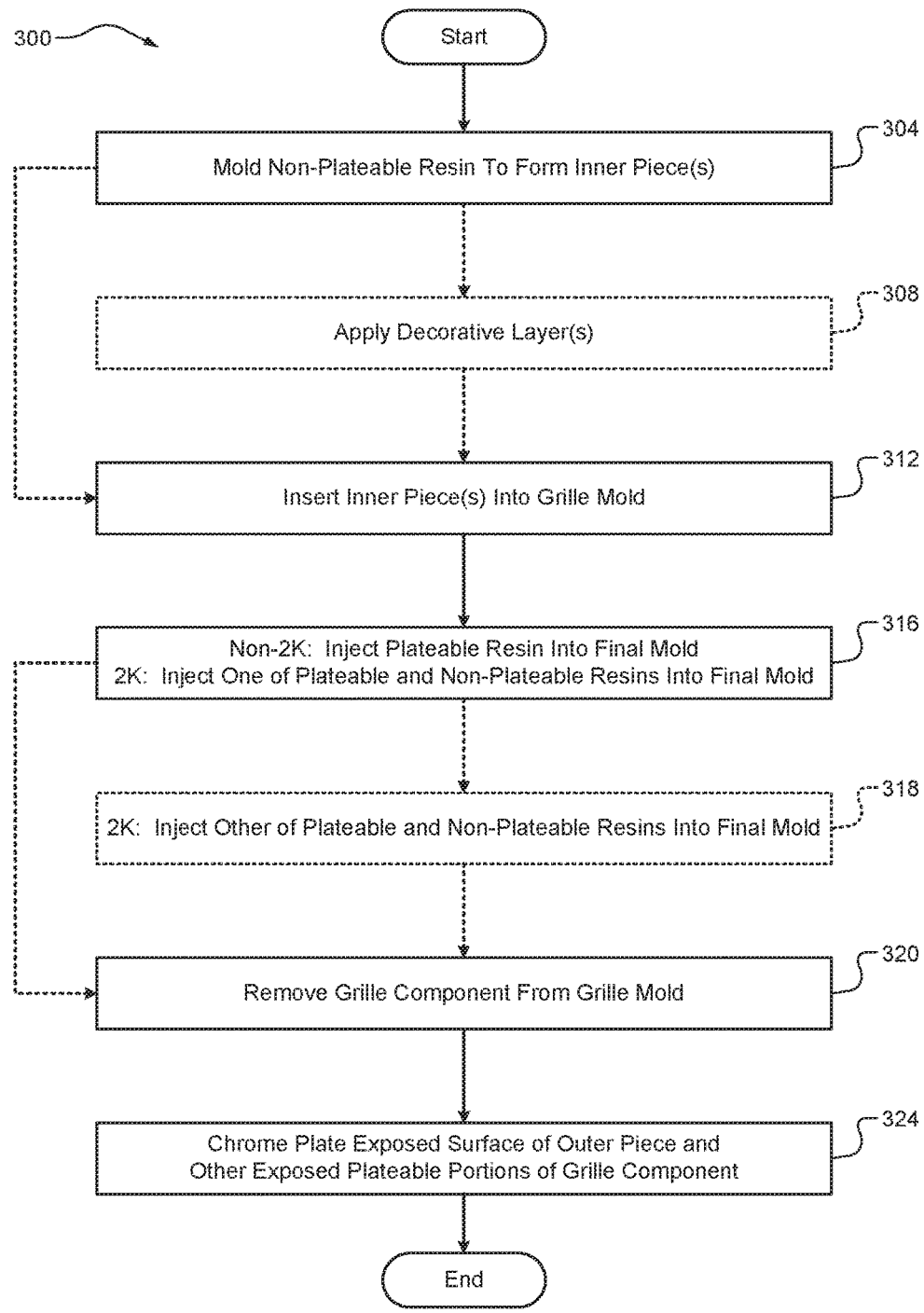
FIG. 3 is a flow diagram of an example method of manufacturing a selectively chrome plated vehicle radiator grille having a radome component integrated therein according to some implementations of the present disclosure.

Referring now to FIG. 3, a flow diagram of an example method 300 for manufacturing a selectively chrome plated vehicle radiator grille having the selectively chrome plated vehicle radome (e.g., radome 100) integrated therewith. At 304, non-plateable resin (e.g., PC or PMMA) is molded to form one or more inner pieces (e.g., inner pieces 112, 144). For the non-2K process, each inner piece can be formed using a separate mold. For the 2K process, on the other hand, the first inner piece 112 (and, optionally, the intermediate inner piece) can be initially molded. At 308, one or more decorative layers are optionally applied to one or more faces of the inner piece(s). At 312, the one or more inner pieces are inserted into a mold (e.g., a final mold). This mold, for example, may be different than the mold used to form the inner piece(s). This mold is also different than the final mold used in method 200 because it is for a full radiator grille instead of only the radome. The final mold of method 200, therefore, can be referred to as a "radome mold" whereas the final mold of method 300 can be referred to as a "grille mold." At 316, plateable resin (e.g., ABS or ABS-PC) is injected into the grille mold. For the 2K process, however, one of the non-plateable and plateable resins could injected into the grille mold at 316 (e.g., inject the non-plateable to form the second back piece 144 and, optionally, the non-plateable portions of the grille) and then the other of the non-plateable and plateable resins is injected into the grille mold at optional 318 (e.g., inject the plateable to form the outer piece 104 and the plateable portions of the grille). At 320, a grille component (i.e., a non-chrome plated grille) having the radome component integrated therewith is removed from the grille mold. At 324, the grille component is chrome plated and the chrome plating adheres to the plateable resin (e.g., the exposed surface of the outer piece 104 and at least some other exposed portions of the grille component that are formed of the plateable resin) to form the selectively chrome plated grille having the radome component integrated therewith.

Figure 4:
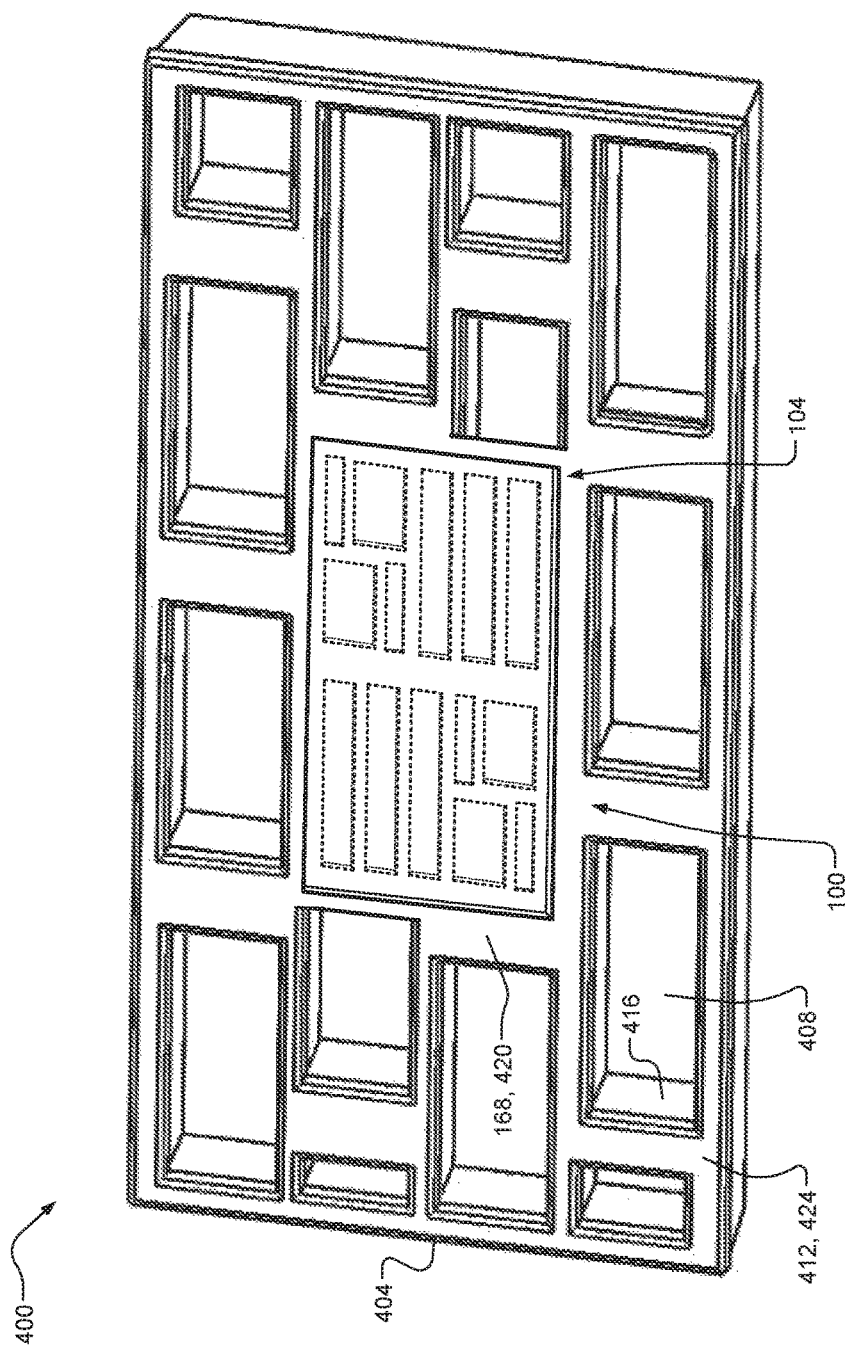
FIG. 4 is a view of an example selectively chrome plated vehicle radiator grille having the selectively chrome plated vehicle radome of FIGS. 1A-1C integrated therewith according to some implementations of the present disclosure.

Referring now to FIG. 4, a selectively chrome plated vehicle radiator grille 400 (hereinafter, "grille 400") is illustrated. The grille 400, for example, could be manufactured using the process described above and illustrated in FIG. 3. While the grille 400 is shown to include the radome 100 from FIGS. 1A-1C, it will be appreciated that the grille 400 could integrate any suitable selectively chrome plated vehicle radome. The grille 400 defines a body or a housing 404 that defines apertures 408 to create a mesh design. While a mesh design is shown, it will be appreciated that the grille 400 can have any suitable design or configuration (e.g., grille bars). The housing body or housing 404 is made up of plateable portions 412 that are formed of plateable resin (e.g., ABS or ABS-PC) and non-plateable portions 416 formed of non-plateable resin (e.g., PC). These non-plateable portions 416, for example, could be molded during the molding of at least one of the inner pieces 112, 144, or the non-plateable portions 416 could be formed before the radome component (i.e., pre-chrome plating) is inserted into the grille mold. The plateable portions 412 can be formed in the grille mold along with the outer piece 104 using a second shot of a 2K molding process. The resulting grille component can then be chrome plated to obtain the chrome plating 168 (on the outer piece 104) and chrome plating 420 on the plateable portions 412 of the grille 400. In some implementations, the radome 100 can be flush with a front surface 424 of the grille 400.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known procedures, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The term "and/or" includes any and all combinations of one or more of the associated listed items. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments. Similarly, method or flowchart steps do not necessarily imply an order of operations (e.g., a step recited after another step could be performed before the other step, unless required as being performed after).

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A selectively chrome plated radome for a vehicle, the selectively chrome plated radome comprising:
   one or more inner pieces each (i) formed of a non-plateable resin and (ii) defining an outer edge;
   one or more decorative layers applied to a face of one of the one or more inner pieces, wherein the one or more decorative layers include at least one of (i) paint, (ii) a colored graphic, and (iii) a metalloid or a post-transition metal deposited via physical vapor deposition (PVD);
   an outer piece formed of a plateable resin and arranged about and coupled to the outer edge of each inner piece; and
   a chrome plating applied to an exposed surface of the outer piece.

2. The selectively chrome plated radome of claim 1, wherein the one or more inner pieces include (i) a front piece formed of the non-plateable resin and defining a first outer edge and (ii) a back piece formed of the non-plateable resin and defining a second outer edge, and wherein the outer piece is arranged about and coupled to the first and second outer edges such that the front and back pieces are held together.

3. The selectively chrome plated radome of claim 2, wherein one of the front and back pieces defines a protrusion, and wherein the other of the front and back pieces defines a recess that corresponds to the protrusion.

4. The selectively chrome plated radome of claim 2, further comprising one or more decorative layers disposed between the front and back pieces, wherein the one or more decorative layers include at least one of (i) paint, (ii) a colored graphic, and (iii) a metalloid or a post-transition metal deposited via physical vapor deposition (PVD).

5. The selectively chrome plated radome of claim 4, wherein the one or more inner pieces further include an intermediary piece (i) formed of one of the non-plateable and plateable resins, (ii) having the one or more decorative layers applied thereto, and (iii) arranged between the front and back pieces.

6. The selectively chrome plated radome of claim 1, wherein the non-plateable resin is one of polycarbonate (PC) and polymethyl methacrylate (PMMA), and wherein the plateable resin is one of acrylonitrile butadiene styrene (ABS) and PC-ABS.

7. The selectively chrome plated radome of claim 1, wherein each inner piece is formed using a separate mold, and wherein the outer piece is overmolded about the outer edges of the inner pieces using a final mold.

8. The selectively chrome plated radome of claim 1, wherein the outer piece is formed during a second shot of a two-shot (2K) injection molding process.

9. A selectively chrome plated radiator grille having the inner and outer pieces of claim 1 integrated therewith, the grille comprising a plateable resin portion that defines the outer piece.

10. A method of manufacturing a selectively chrome plated radome for a vehicle, the method comprising:
    molding a non-plateable resin in one or first molds to form one or more inner pieces, each inner piece defining an outer edge;
    inserting the one or more inner pieces into a second mold;
    injecting a plateable resin into the second mold to form an outer piece arranged about and coupled to the outer edge of each inner piece, wherein the one or more inner pieces and the outer piece collectively form a radome component;
    removing the radome component from the second mold; and
    chrome plating an exposed surface of the outer piece of the radome component to obtain the selectively chrome plated radome.

11. The method of claim 10, further comprising applying one or more decorative layers to a face of one of the one or more inner pieces, wherein the one or more decorative layers include at least one of (i) paint, (ii) a colored graphic, and (iii) a metalloid or a post-transition metal deposited via physical vapor deposition (PVD).

12. The method of claim 10, wherein the one or more inner pieces include (i) a front piece formed of the non-plateable resin and defining a first outer edge and (ii) a back piece formed of the non-plateable resin and defining a second outer edge, and wherein the outer piece is arranged about and coupled to the first and second outer edges such that the front and back pieces are held together.

13. The method of claim 12, wherein one of the front and back pieces defines a protrusion, and wherein the other of the front and back pieces defines a recess that corresponds to the protrusion.

14. The method of claim 12, further comprising applying one or more decorative layers between the front and back pieces, wherein the one or more decorative layers include at least one of (i) paint, (ii) a colored graphic, and (iii) a metalloid or a post-transition metal deposited via physical vapor deposition (PVD).

15. The method of claim 14, wherein the one or more inner pieces further include an intermediary piece (i) formed of one of the non-plateable and plateable resins, (ii) having the one or more decorative layers applied thereto, and (iii) arranged between the front and back pieces.

16. The method of claim 10, further comprising manufacturing a selectively chrome plated radiator grille by:
inserting the one or more inner pieces into a third mold;
injecting the plateable resin into the third mold to form a radiator grille component comprising a plateable resin portion defining the outer piece;
removing the radiator grille component from the third mold; and
chrome plating an exposed surface of the plateable resin portion of the radiator grille component to obtain the chrome plated radiator grille having the radome component integrated therewith.

17. The method of claim 16, wherein the one or more inner pieces comprise at least a front piece and a back piece, and further comprising performing a two-shot (2K) injection molding process comprising:
inserting the front piece into the third mold;
after inserting the one of the front piece into the third mold, performing a first shot by injecting into the third mold one of (i) the non-plateable resin to form a non-plateable resin portion of the radiator grille component defining the back piece and (ii) the plateable resin to form the plateable resin portion of the radiator grille component; and
after performing the first shot, performing a second shot by injecting into the third mold the other of (i) the non-plateable resin to form the non-plateable resin portion of the radiator grille component and (ii) the plateable resin to form the plateable resin portion of the radiator grille component.

18. The method of claim 10, wherein the non-plateable resin is one of polycarbonate (PC) and polymethyl methacrylate (PMMA), and wherein the plateable resin is one of acrylonitrile butadiene styrene (ABS) and PC-ABS.

19. The method of claim 10, further comprising performing a two-shot (2K) injection molding process, wherein a second shot of the 2K injection molding process involves injecting the plateable resin into the second mold.

* * * * *